(12) United States Patent
Kobayakawa

(10) Patent No.: US 9,379,290 B2
(45) Date of Patent: *Jun. 28, 2016

(54) LED MODULE

(71) Applicant: ROHM CO., LTD., Kyoto (JP)

(72) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/639,618

(22) Filed: Mar. 5, 2015

(65) Prior Publication Data

US 2015/0179898 A1 Jun. 25, 2015

Related U.S. Application Data

(63) Continuation of application No. 14/230,631, filed on Mar. 31, 2014, now Pat. No. 8,994,062, which is a continuation of application No. 13/397,110, filed on Feb. 15, 2012, now Pat. No. 8,723,215.

(30) Foreign Application Priority Data

Feb. 16, 2011 (JP) .................................. 2011-30331
Jan. 19, 2012 (JP) .................................. 2012-8741

(51) Int. Cl.
*H01L 33/48* (2010.01)
*H01L 33/52* (2010.01)
(Continued)

(52) U.S. Cl.
CPC .............. *H01L 33/486* (2013.01); *H01L 33/52* (2013.01); *H01L 33/54* (2013.01); *H01L 33/56* (2013.01); *H01L 33/62* (2013.01); *H01L 33/60* (2013.01); *H01L 2224/48091* (2013.01); *H01L 2224/48227* (2013.01); *H01L 2224/48465* (2013.01); *H01L 2924/00* (2013.01); *H01L 2924/00014* (2013.01); *H01L 2924/3011* (2013.01)

(58) Field of Classification Search
USPC ......................................................... 257/99
See application file for complete search history.

(56) References Cited

U.S. PATENT DOCUMENTS 7,045,828 B2 5/2006 Shimizu et al.
7,064,420 B2 6/2006 Han et al.
(Continued)

FOREIGN PATENT DOCUMENTS

CN 1315057 9/2001
CN 101515627 8/2009
(Continued)

OTHER PUBLICATIONS

Chinese Office Action, issued in the corresponding Chinese application serial No. CN201210035595.5, dated Jul. 29, 2015, 16 pages.
(Continued)

*Primary Examiner* — Thao P Le
(74) *Attorney, Agent, or Firm* — Hamre, Schumann, Mueller & Larson, P.C.

(57) ABSTRACT

A LED module includes a substrate, a LED chip supported on the substrate, a metal wiring installed on the substrate, the metal wiring including a mounting portion on which the LED chip is mounted, an encapsulating resin configured to cover the LED chip and the metal wiring, and a clad member configured to cover the metal wiring to expose the mounting portion, the encapsulating resin arranged to cover the clad member.

24 Claims, 10 Drawing Sheets

(51) Int. Cl.
*H01L 33/56* (2010.01)
*H01L 33/62* (2010.01)
*H01L 33/54* (2010.01)
*H01L 33/60* (2010.01)

(56) References Cited

U.S. PATENT DOCUMENTS

| | | | |
|---|---|---|---|
| 7,250,637 B2 | 7/2007 | Shimizu et al. | |
| 7,714,348 B2 * | 5/2010 | Fan et al. | 257/99 |
| 8,723,215 B2 * | 5/2014 | Kobayakawa | 257/99 |
| 2004/0188700 A1 | 9/2004 | Fukasawa et al. | |
| 2005/0242362 A1 | 11/2005 | Shimizu et al. | |
| 2007/0096136 A1 * | 5/2007 | Sun | 257/99 |
| 2009/0194782 A1 | 8/2009 | Hata et al. | |
| 2010/0102344 A1 | 4/2010 | Ueji | |
| 2010/0148196 A1 | 6/2010 | Kamada et al. | |
| 2011/0163345 A1 | 7/2011 | Fukunaga et al. | |
| 2012/0061702 A1 | 3/2012 | Andrews et al. | |

FOREIGN PATENT DOCUMENTS

| | | |
|---|---|---|
| JP | 08-330637 | 12/1996 |
| JP | 2000-277809 | 10/2000 |
| JP | 2003-023183 | 1/2003 |
| JP | 2003-051620 | 2/2003 |
| JP | 2007-059837 | 3/2007 |
| JP | 2008-218678 | 9/2008 |
| JP | 2009-289441 | 12/2009 |

OTHER PUBLICATIONS

Chinese Office Action issued in the corresponding Chinese patent application No. 201210035595.5, dated Mar. 10, 2016, 10 pages.

* cited by examiner

LED MODULE

CROSS-REFERENCE TO RELATED APPLICATIONS

This application is a Continuation of application Ser. No. 14/230,631, filed Mar. 31, 2014, which is a Continuation of application Ser. No. 13/397,110, filed Feb. 15, 2012, which is based upon and claims the benefit of priority from Japan Patent Application Nos. 2012-008741 and 2011-30331, filed on Jan. 19, 2012 and Feb. 16, 2011, respectively, the entire contents of which are incorporated herein by reference.

TECHNICAL FIELD

The present disclosure relates to a LED module having a light emitting diode (hereinafter referred to as a "LED") arranged therein.

BACKGROUND

One example of a LED module is shown in FIG. 10. The LED module X shown in FIG. 10 includes a substrate 91, metal electrodes 92 and 93 arranged in the substrate 91, a LED chip 94 electrically connected to the metal electrodes 92 and 93, a wire 95 and an encapsulating resin 96 covering these components. The substrate 91 is made of, e.g., a glass epoxy resin. The metal electrodes 92 and 93 are spaced apart from each other at the opposite marginal edges of the substrate 91. Each of the metal electrodes 92 and 93 covers a region extending from the front surface of the substrate 91 to the rear surface across the side surface. The LED chip 94 is mounted on the portion of the metal electrode 92 covering the front surface of the substrate 91. One end of the wire 95 is fixed to the portion of the metal electrode 93 covering the front surface of the substrate 91. The other end of the wire 95 is connected to the LED chip 94. The LED module X, when in use, is embedded to, e.g., a circuit board 97 built in an illuminating device. As shown in FIG. 10, the portions of the metal electrodes 92 and 93 covering the rear surface of the substrate 91 are connected to wiring lines 98 provided in the circuit board 97. When installing the LED module X on the circuit board 97, a process is performed in which the LED module X and the circuit board 97 are heated in a reflow furnace with solder materials inserted between the metal electrodes 92 and 93 and the wiring lines 98.

The encapsulating resin 96 is provided to protect the LED chip 94 and the wire 95 and is formed of an epoxy resin transparent to the light emitted from the LED chip 94. The encapsulating resin 96 is formed to cover the portions of the metal electrodes 92 and 93 positioned on the front surface of the substrate 91. Gold-plated layers are often formed on the surfaces of the metal electrodes 92 and 93 in order to increase the conductivity. However, the epoxy resin and the gold are not easily bonded to each other, possibly posing a problem set forth below. As stated above, a heating process is performed when installing the LED module X on the circuit board 97. At this time, the encapsulating resin 96 is thermally deformed. However, the encapsulating resin 96 and the metal electrodes 92 and 93 may be exfoliated, since the epoxy resin and the gold-plated layer are not strongly bonded together. If such situation occurs, there is a possibility that the LED chips 94 are not turned on.

SUMMARY

The present disclosure provides some embodiments of a highly reliable LED module conceived in view of the aforementioned circumstances.

According to one aspect of the present disclosure, there is provided a LED module. The LED module includes a substrate, a LED chip, a metal wiring, an encapsulating resin and a clad member. The LED chip is supported on the substrate. The metal wiring is installed on the substrate and has a mounting portion on which the LED chip is mounted. The encapsulating resin covers the LED chip and the metal wiring. The clad member covers the metal wiring to expose the mounting portion. With this configuration, the encapsulating resin is arranged to cover the clad member.

In one embodiment, the clad member has an opening formed to permit installation of the LED chip when seen in a thickness direction of the substrate.

For example, the mounting portion has a rectangular shape when seen in the thickness direction of the substrate, and the opening has a circular shape when seen in the thickness direction of the substrate.

In another embodiment, the clad member partially covers the mounting portion.

In another embodiment, the metal wiring includes a wire bonding portion spaced apart from the mounting portion, and a wire configured to interconnect the LED chip and the wire bonding portion. The clad member is arranged to cover the metal wiring to expose the wire bonding portion.

In another embodiment, the clad member has a recess dented to approach the mounting portion in an extension direction of the wire. The recess is positioned to overlap with the wire bonding portion when seen in the thickness direction of the substrate.

In another embodiment, the metal wiring includes a first metal electrode containing the mounting portion and a second metal electrode containing the wire bonding portion. The first metal electrode covers a first edge of the substrate in a first direction. The second metal electrode covers a second edge of the substrate opposite the first edge. The encapsulating resin is shorter than the substrate.

In another embodiment, the substrate includes a pair of concave portions located at opposite ends of the substrate, the pair of concave portions including depressed toward one another. The metal wiring is arranged to cover the pair of the concave portions, and the encapsulating resin is formed to expose the pair of the concave portions.

In another embodiment, a first end of the clad member and a first end of the encapsulating resin are at the same position in the first direction.

In another embodiment, a first end of the clad member extends toward a first end of the substrate further than a first end of the encapsulating resin in the first direction.

In another embodiment, a second end of the clad member and a second end of the encapsulating resin are at the same position in the first direction.

In another embodiment, a second end of the clad member extends further toward a second end of the substrate than a second end of the encapsulating resin in the first direction.

In another embodiment, the encapsulating resin is formed to cover entire width of the substrate in a second direction orthogonal to the first direction. The opposite ends of the clad member and the opposite ends of the substrate are at the same position in the second direction.

In another embodiment of the present disclosure, the substrate is formed longer than the encapsulating resin in the first direction. A first side surface of the encapsulating resin inclines toward a second side surface in the first direction.

For example, the first side surface of the encapsulating resin includes an inclined surface inclined 6 degrees or more with respect to the thickness direction of the substrate.

In an additional embodiment, the first side surface of the encapsulating resin has a curved surface.

The second side surface of the encapsulating resin inclines toward the first side surface in the first direction.

For example, the second side surface of the encapsulating resin includes an inclined surface inclined 6 degrees or more with respect to the thickness direction of the substrate.

In an additional embodiment, the second side surface of the encapsulating resin includes a curved surface.

In yet another embodiment of the present disclosure, the clad member is made of a material with which the adhesion strength between the clad member and the metal wiring and the adhesion strength between the clad member and the encapsulating resin become greater than the adhesion strength between the metal wiring and the encapsulating resin.

For example, the metal wiring has a gold-plated layer.

For example, the clad member is made of a resin.

For example, the clad member has a white color.

For example, the clad member has a thickness of 1 μm to 10 μm.

BRIEF DESCRIPTION OF THE DRAWINGS

Other features and advantages of the present disclosure will become more apparent from the following detailed description of some embodiments made in conjunction with the accompanying drawings.

DETAILED DESCRIPTION

Some embodiments of the present disclosure will now be described in detail with reference to the drawings.

Figure 1:
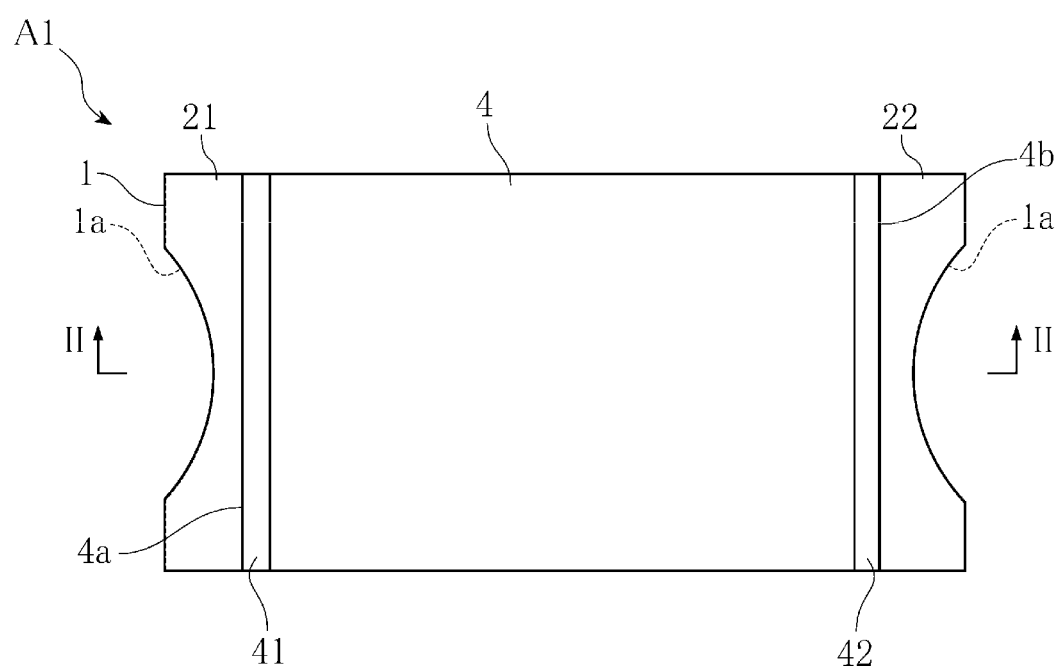
FIG. 1 is a plan view showing a LED module according to a first embodiment of the present disclosure.
Figure 2:
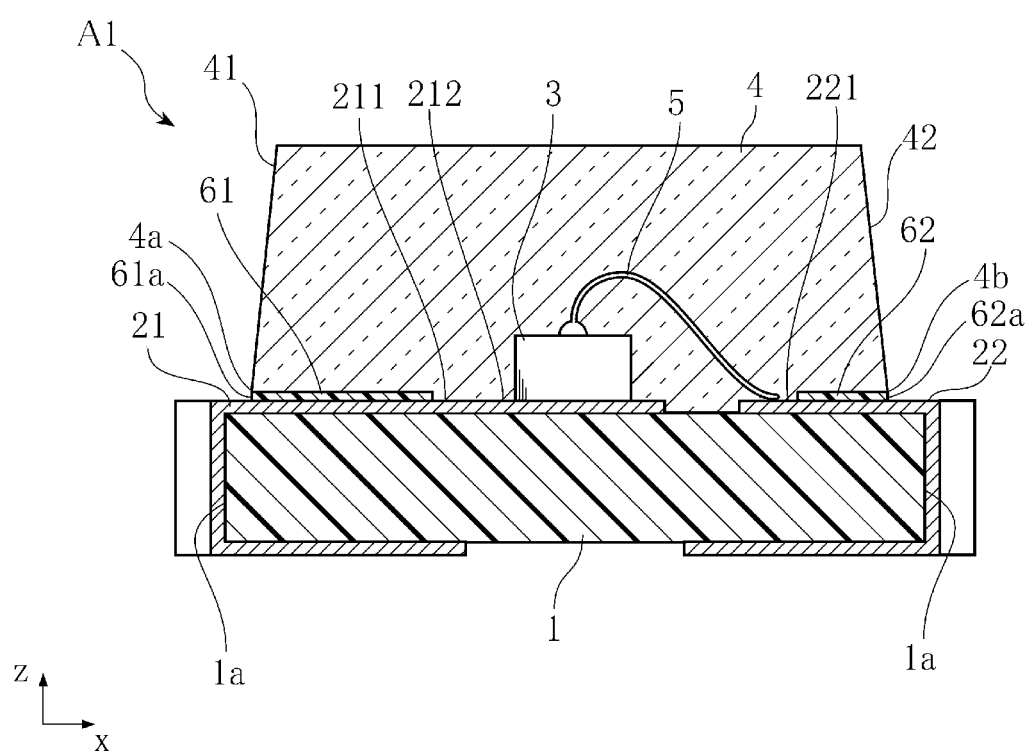
FIG. 2 is a section view taken along line II-II in FIG. 1.
Figure 3:
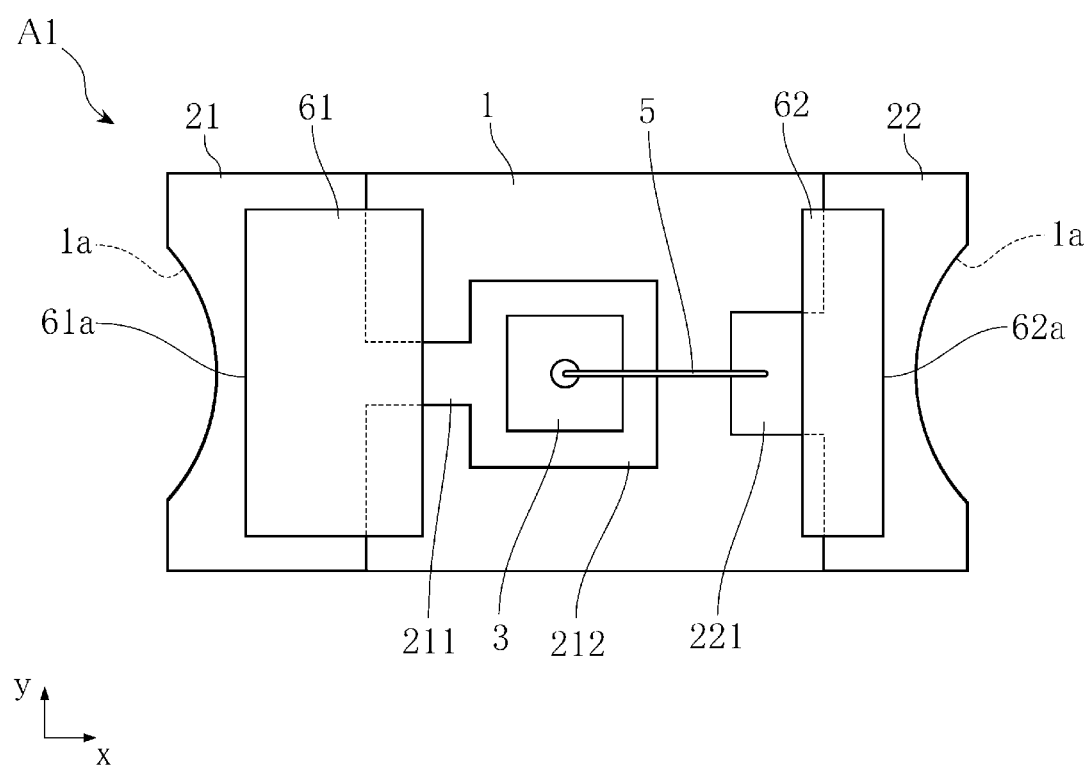
FIG. 3 is a plan view of the LED module shown in FIG. 1, with an encapsulating resin omitted for clarity.

FIGS. 1 through 3 show a LED module according to a first embodiment of the present disclosure. The LED module A1 shown in FIGS. 1 through 3 includes a substrate 1, a metal wiring 2, a LED chip 3, an encapsulating resin 4, a wire 5 and a clad member 6. In FIG. 3, the encapsulating resin 4 is omitted to illustrate the interior of the LED module A1. The x, y and z directions indicated in FIGS. 1 through 3 are orthogonal to one another. The z direction is the thickness direction of the substrate 1. In the following description, the upper surface of the substrate 1 in the z direction in FIG. 2 will be referred to as a front surface, the lower surface as rear surface and the opposite end surfaces in the x direction as side surfaces.

The substrate 1 is made of, e.g., a glass epoxy resin. When seen in the z direction as in FIG. 3, the substrate 1 has an elongated rectangular shape extending in the x direction. A pair of concave portions 1a depressed in the x direction is formed in opposite end portions of the substrate 1 in the x-direction. The substrate 1 is manufactured, for example, by cutting a substrate material. In the manufacturing process, a plurality of through-holes is formed in the substrate material. The concave portions 1a are formed by cutting the through-holes.

The metal wiring 2 includes a metal electrode 21 and a metal electrode 22. The metal electrode 21 and the metal electrode 22 are spaced apart from each other in the x-direction and arranged at opposite edges of the substrate 1. Each of the metal electrodes 21 and 22 covers a region extending from the front surface of the substrate 1 to the rear surface across the side surface. In the present embodiment, the metal electrodes 21 and 22 cover only the concave portions 1a of the side surfaces of the substrate 1. The regions of the metal electrode 21 and the metal electrode 22 positioned on the front surface of the substrate 1 are used in mounting the LED module A1 to a desired circuit board as described earlier.

As shown in FIG. 3, the metal electrode 21 includes a region covering the left end portion of the substrate 1 over the full width in the y direction. The metal electrode 21 further includes a narrow band portion 211 protruding from the region toward the x-direction, which is the right direction in FIG. 3. In addition, a mounting portion 212 connected to the right end of the narrow band portion 211 in the x-direction is also included in the metal electrode 21. In the example shown in FIG. 3, the mounting portion 212 has a square shape when seen in the z direction. The length of one side of the mounting portion 212 is larger than the length of one side of the LED chip 3 but is smaller than the y-direction width of the substrate 1. The narrow band portion 211 is formed such that the y-direction width thereof becomes smaller than the length of one side of the mounting portion 212.

As illustrated in FIG. 3, the metal electrode 22 includes a region covering the right end portion of the substrate 1 over the full width in the y direction and a narrow band portion 221 protruding from the region toward the x-direction, which is the left side in FIG. 3. In the example illustrated in FIG. 3, the y-direction width of the narrow band portion 221 is smaller than the length of one side of the mounting portion 212. The right end in FIG. 3 of the wire 5 is connected to the narrow band portion 221. The section of the narrow band portion 221 not covered with the clad member 6 corresponds to a wire bonding section referred to in the present disclosure.

While omitted in the example shown in FIG. 2, the metal wiring 2 is formed of a plurality of metal layers laminated one above another. Among the metal layers, the outermost metal layer is formed of gold. The metal wiring 2 can be formed by subjecting the afore-mentioned substrate material to a plating treatment and etching away unnecessary portions. At this time, a structure in which the metal wiring 2 covers the concave portions 1a can be easily realized by performing the plating treatment to cover the inner circumferential surfaces of the through-holes formed in the substrate material.

The LED chip 3 is, e.g., a pn-type semiconductor device, and is configured to emit visible light or infrared light. The LED chip 3 has an n-side electrode formed on the lower surface thereof in FIG. 2. The n-side electrode is electrically connected to the mounting portion 212 through a silver paste which is not shown. The LED chip 3 has a p-side electrode formed on the upper surface thereof in FIG. 2. The p-side electrode is electrically connected to the narrow band portion 221 through the wire 5.

The encapsulating resin 4 is provided to protect the LED chip 3 and the wire 5, and is formed of, e.g., an epoxy resin transparent to the light emitted from the LED chip 3. The x-direction length of the encapsulating resin 4 is smaller than the x-direction length of the substrate 1. The y-direction length of the encapsulating resin 4 is equal to the y-direction length of the substrate 1. As shown in FIG. 1, the encapsulating resin 4 has an x-direction left end 4a positioned at the right side of the left concave portion 1a of the substrate 1 and an x-direction right end 4b positioned at the left side of the right concave portion 1a of the substrate 1. As shown in FIG. 2, the x-direction left side surface 41 of the encapsulating resin 4 is an inclined surface, which is positioned to the x-direction right side as it extends toward the upper side in the z direction. The side surface 41 is inclined 6 degrees or more with respect to the z direction. The x-direction right side surface 42 of the encapsulating resin 4 is an inclined surface, which is positioned at the x-direction left side as it extends toward the upper side in the z direction. The side surface 42 is inclined 6 degrees or more with respect to the z direction. The encapsulating resin 4 can be formed by a transfer molding method. The transfer molding method includes a step of installing the afore-mentioned substrate material in a mold and filling a molten resin into the mold and a step of pulling the mold and the substrate material apart after the resin is cured.

The wire 5 is made of gold and is formed through the use of, e.g., a commercially available wire bonding capillary.

As shown in FIG. 2, the clad member 6 covers the metal wiring 2 and is covered with the encapsulating resin 4. The clad member 6 is made of a material with which the adhesion strength between the clad member 6 and the metal wiring 2 and the adhesion strength between the clad member 6 and the encapsulating resin 4 become greater than the adhesion strength between the metal wiring 2 and the encapsulating resin 4. For example, the clad member 6 may be a resin film having a z-direction thickness of 1 µm to 10 µm. As the resin film, it is possible to use, e.g., a resist employed in an etching process. It may also be possible to use a solder resist employed in a soldering process. If a white resist is used as the clad member 6, it becomes easy for the clad member 6 to reflect the light emitted from the LED chip 3. For that reason, the use of the white resist as the clad member 6 may provide an effect of increasing the quantity of light emitted in the z direction from the LED module A1.

In the example shown in FIG. 3, the clad member 6 is formed at least in a region other than a region where the LED chip 3 is die-bonded and a region where the wire 5 is bonded. The clad member 6 includes a first clad member 61 and a second clad member 62 spaced apart from each other in the x direction. As shown in FIG. 3, the first clad member 61 is formed into an elongated rectangular shape extending in the y direction when seen in the z direction. The y-direction length of the first clad member 61 is smaller than the y-direction length of the substrate 1. The x-direction right end portion of the first clad member 61 partially covers the narrow band portion 211. As shown in FIG. 2, the x-direction left end 61a of the first clad member 61 lies in the same position as the x-direction left end 4a of the encapsulating resin 4 in the x direction.

As shown in FIG. 3, the second clad member 62 is formed into an elongated rectangular shape extending in the y direction when seen in the z direction. The y-direction length of the second clad member 62 is smaller than the y-direction length of the substrate 1. The x-direction left end portion of the second clad member 62 partially covers the narrow band portion 221. As shown in FIG. 2, the x-direction right end 62a of the second clad member 62 lies in the same position as the x-direction right end 4b of the encapsulating resin 4 in the x direction. In addition, the first clad member 61 is formed to cover not only the upper surface in FIG. 2 of the metal electrode 21 of the metal wiring 2 but also the front surface of the substrate 1. The second clad member 62 is formed to cover not only the upper surface in FIG. 2 of the metal electrode 22 of the metal wiring 2 but also the front surface of the substrate 1.

Next, description will be made on the operation of the LED module A1.

In the LED module A1 set forth above, the clad member 6 is provided between the metal wiring 2 and the encapsulating resin 4. As stated in the description of the example, if a gold layer is formed on the surface of the metal wiring 2, it causes a problem in that the metal wiring 2 and the encapsulating resin 4 are not easily bonded to each other, while it provides superior conductivity. In the LED module A1, an attempt is made to solve the problem by inserting the clad member 6 between the metal wiring 2 and the encapsulating resin 4. Thus the LED module A1 has a configuration that is easy to enhance the reliability thereof.

In the LED module A1, the side surfaces 41 and 42 of the encapsulating resin 4 are formed of inclined surfaces. This helps to prevent the encapsulating resin 4 from being caught in a mold when pulling the mold apart from the substrate material after a resin is cured in a transfer molding method. If the encapsulating resin 4 is caught in the mold, a force is applied for a long period of time in a direction in which the encapsulating resin 4 and the substrate 1 are pulled apart from each other. This increases the risk of causing exfoliation of the encapsulating resin 4 from the metal wiring 2. The LED module A1 is capable of preventing such problem and, therefore, has a configuration that assists in enhancing the reliability thereof.

In the example shown in FIG. 3, the y-direction length of the clad member 6 is smaller than the y-direction length of the substrate 1. Alternatively, the y-direction length of the clad member 6 may be equal to the y-direction length of the substrate 1.

In the embodiment described above, the clad member 6 does not protrude outward from the encapsulating resin 4. Alternatively, the clad member 6 may protrude outward from the encapsulating resin 4.

FIGS. 4 through 9 show other embodiments of the present disclosure. In these figures, the components identical with or similar to those of the foregoing embodiment will be designated by the same reference symbols as used in the foregoing embodiment. Description of these components will be omitted, if appropriate.

Figure 4:
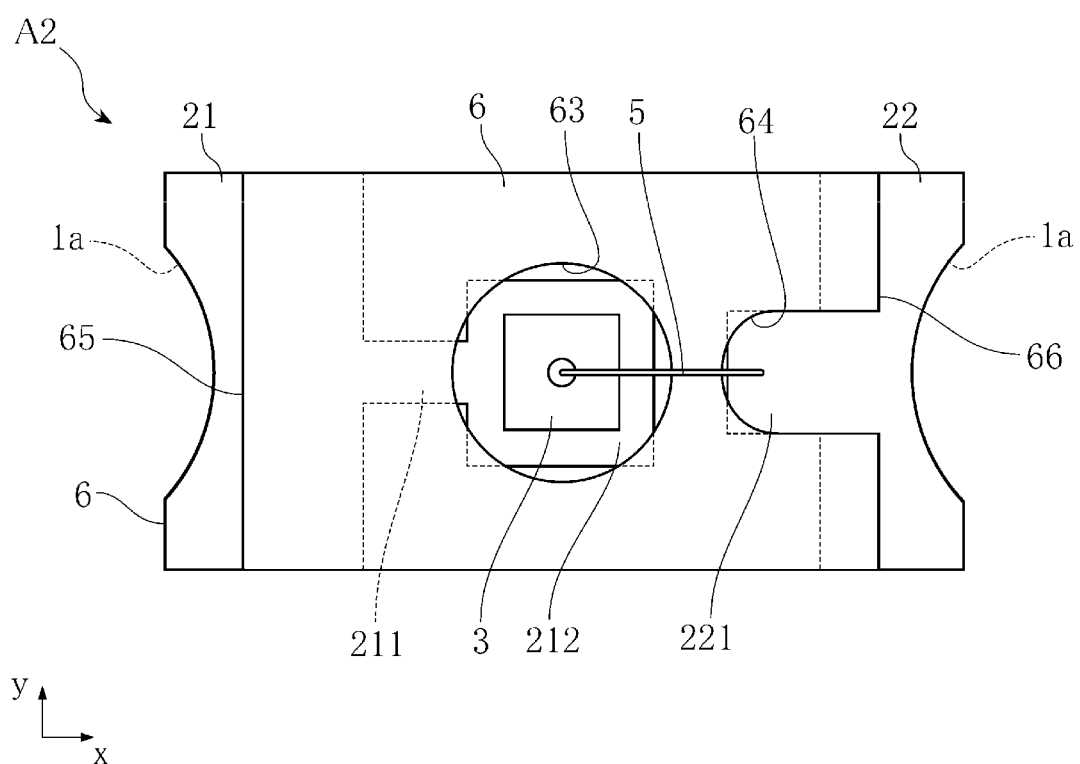
FIG. 4 is a plan view showing a LED module according to a second embodiment of the present disclosure, with an encapsulating resin omitted for clarity.

FIG. 4 shows a LED module A2 according to a second embodiment of the present disclosure. The LED module A2 shown in FIG. 4 differs in shape from the clad member 6 from the LED module A1. Other configurations of the LED module A2 remain the same as those of the LED module A1. FIG. 4 is a plan view of the LED module A2 with the encapsulating resin 4 thereof omitted for clarity.

As shown in FIG. 4, the clad member 6 of the present embodiment is formed to cover almost all portions of the substrate 1 except the opposite end portions thereof when seen in the z direction. The clad member 6 includes an opening 63 through which the mounting portion 212 is partially exposed and a recess 64 through which the narrow band portion 221 is partially exposed.

In a region other than the regions where the opening 63 and the recess 64 are formed, the clad member 6 of the LED module A2 covers the substrate 1 over the full length in the y-direction. In the x-direction opposite ends 65 and 66 of the clad member 6 may overlap with the x-direction opposite ends (see 4*a* and 4*b* in FIG. 1) of the encapsulating resin 4 which is not shown. The clad member 6 may protrude outward from the encapsulating resin 4.

In the example shown in FIG. 4, the opening 63 has a circular shape when seen in the z direction. The four corners of the mounting portion 212 are covered with the clad member 6. The size of the opening 63 may be set to have an area great enough to permit installation of the LED chip 3 and can be changed, if appropriate.

In the example shown in FIG. 4, the recess 64 is formed so that it can be depressed from the x-direction right end 66 of the clad member 6 toward the x-direction left side. The recess 64 may expose the narrow band portion 221 over an area only required in bonding the wire 5 to the narrow band portion 221. The shape of the recess 64 can be changed, if appropriate.

Figure 9:
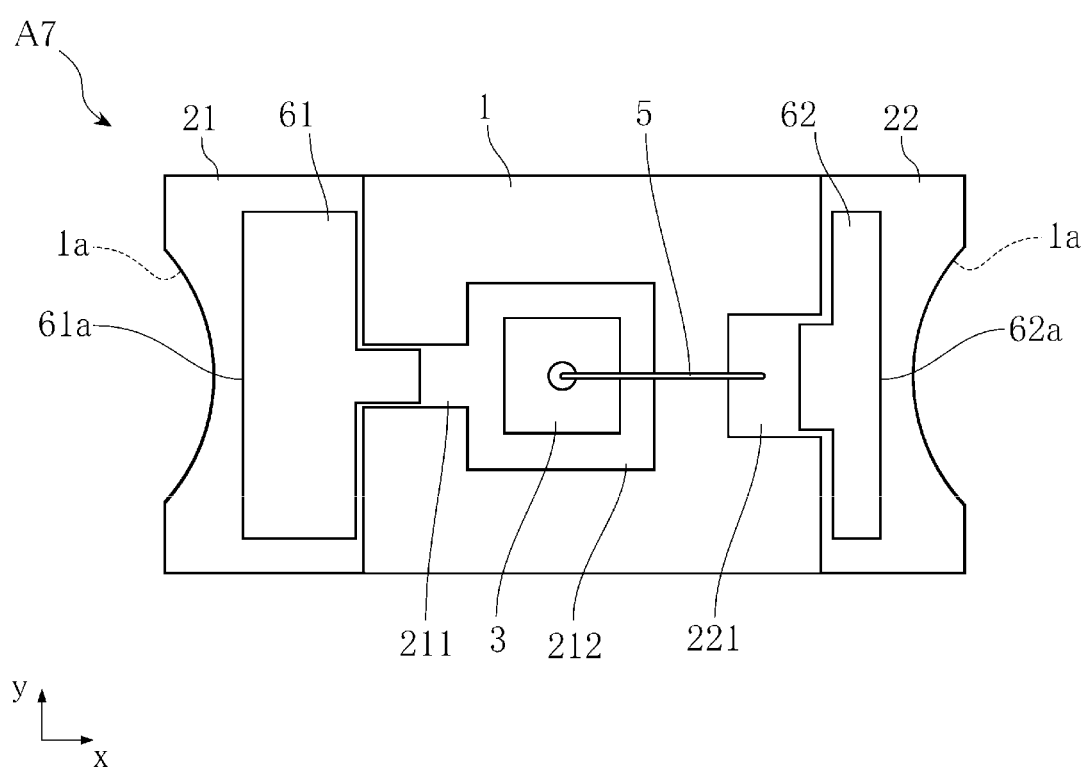
FIG. 9 is a plan view showing a LED module according to a seventh embodiment of the present disclosure, with an encapsulating resin omitted for clarity.
Figure 10:
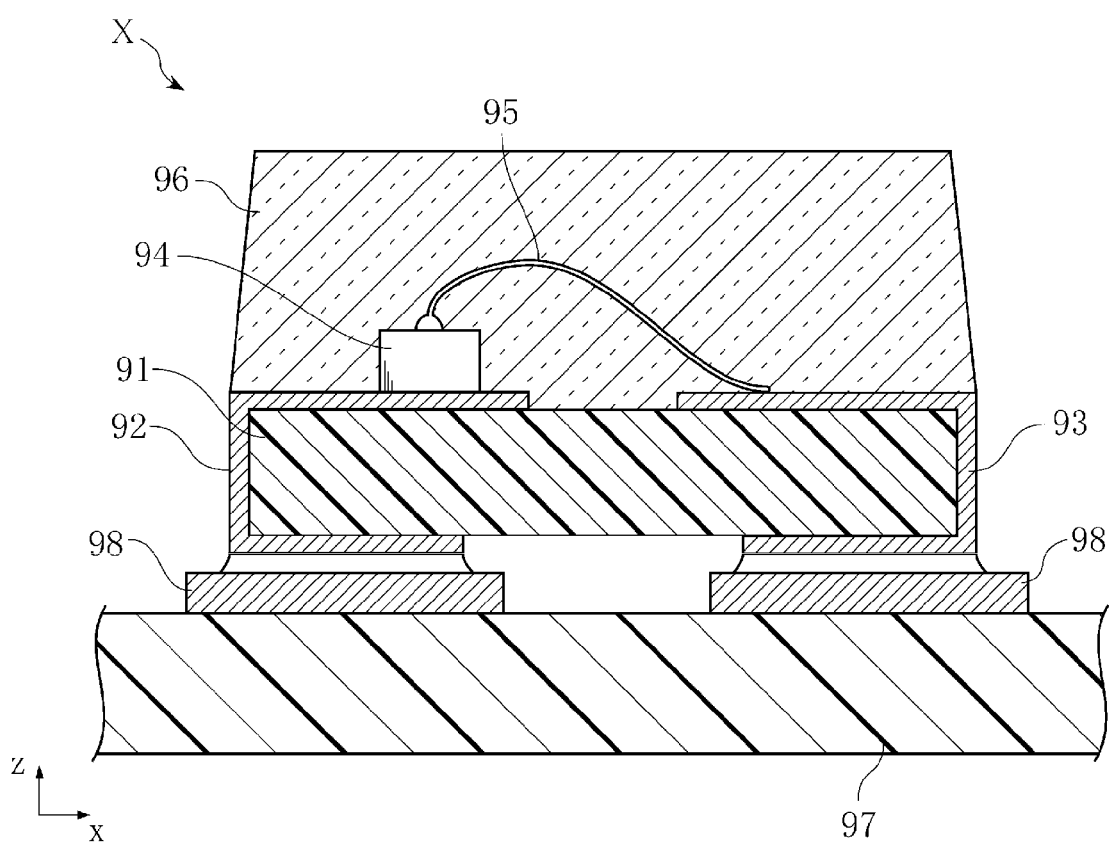
FIG. 10 is a section view illustrating one example of conventional LED modules.

The clad member 6 may be greater in the reflectance of the light emitted from the LED chip 3 than the substrate 1. As shown in FIG. 4, the front surface of the substrate 1 is covered with the clad member 6. The clad member 6 employed in the present embodiment has a relatively high reflectance. Therefore, as compared with when the front surface of the substrate 1 is not covered with the clad member 6, it is possible to enhance the light extraction efficiency. On the contrary, if the reflectance of the clad member 6 is smaller than that of the substrate 1, the area of the front surface of the substrate 1 covered with the clad member 6 may be made smaller as is the case in FIG. 1, or the clad member 6 may be formed to cover only the upper surface of the metal wiring 2 as is illustrated in FIG. 9.

Figure 5:
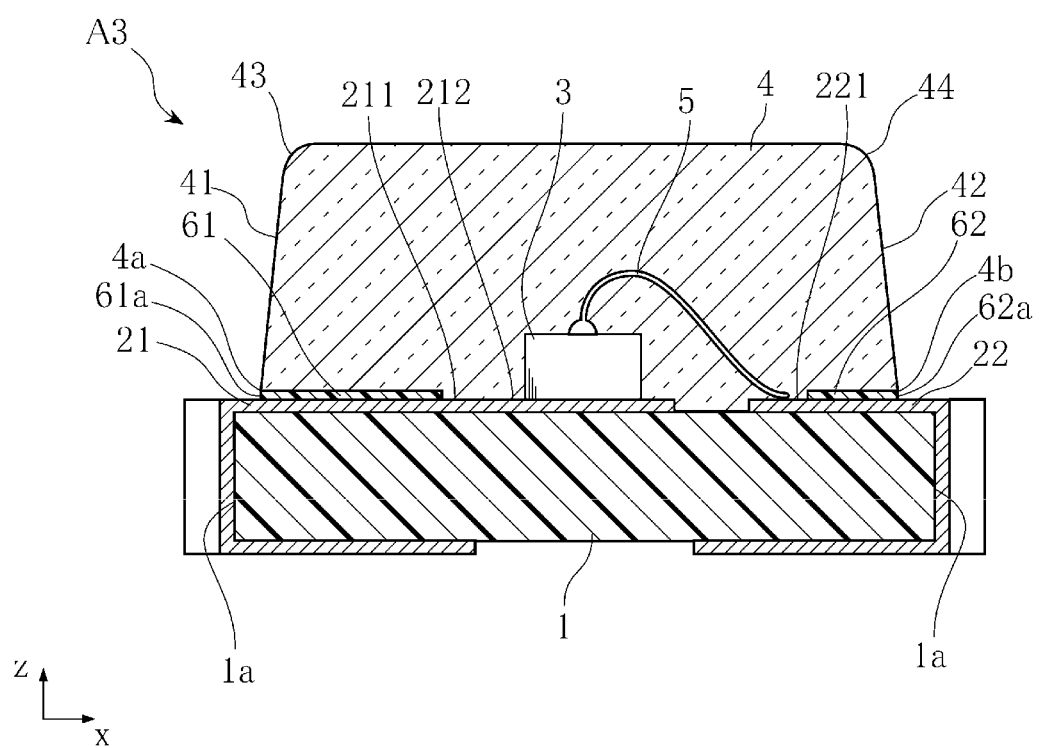
FIG. 5 is a section view showing a LED module according to a third embodiment of the present disclosure.

FIG. 5 shows a LED module A3 according to a third embodiment of the present disclosure. In the LED module A3 shown in FIG. 5, the edges of the encapsulating resin 4 are formed into a round shape. Other configurations of the LED module A3 remain the same as those of the LED module A1.

In the present embodiment, curved surfaces 43 and 44 are provided between the side surfaces 41 and 42 and the z-direction upper surface of the encapsulating resin 4 in FIG. 5. By providing the curved surfaces 43 and 44, it is possible to provide an effect of further reducing a resistance when the encapsulating resin 4 is pulled out from the mold.

Figure 6:
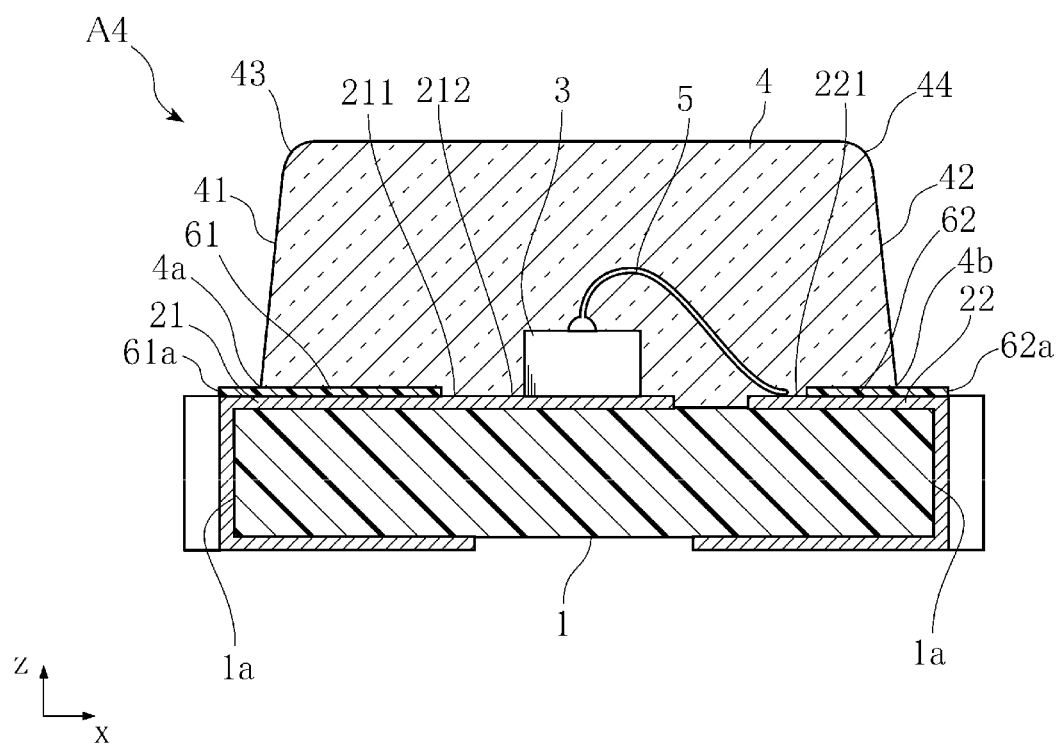
FIG. 6 is a section view showing a LED module according to a fourth embodiment of the present disclosure.

FIG. 6 shows a LED module A4 according to a fourth embodiment of the present disclosure. In the LED module A4 shown in FIG. 6, the clad member 6 is formed to protrude from the encapsulating resin 4. Other configurations of the LED module A4 remain the same as those of the LED module A3.

As shown in FIG. 6, the left end 61*a* of the first clad member 61 is positioned at the left side of the left end 4*a* of the encapsulating resin 4 in the x direction. In the example shown in FIG. 6, the left end 61*a* of the first clad member 61 reaches the left end of the metal wiring 2. Alternatively, the left end 61*a* of the first clad member 61 may be positioned between the left end 4*a* of the encapsulating resin 4 and the left end of the metal wiring 2.

The right end 62*a* of the second clad member 62 is positioned at the right side of the right end 4*b* in FIG. 6 of the encapsulating resin 4 in the x direction. In the example shown in FIG. 6, the right end 62*a* of the second clad member 62 reaches the right end of the metal wiring 2. Alternatively, the right end 62*a* of the second clad member 62 may be positioned between the right end 4*b* of the encapsulating resin 4 and the right end of the metal wiring 2.

Figure 7:
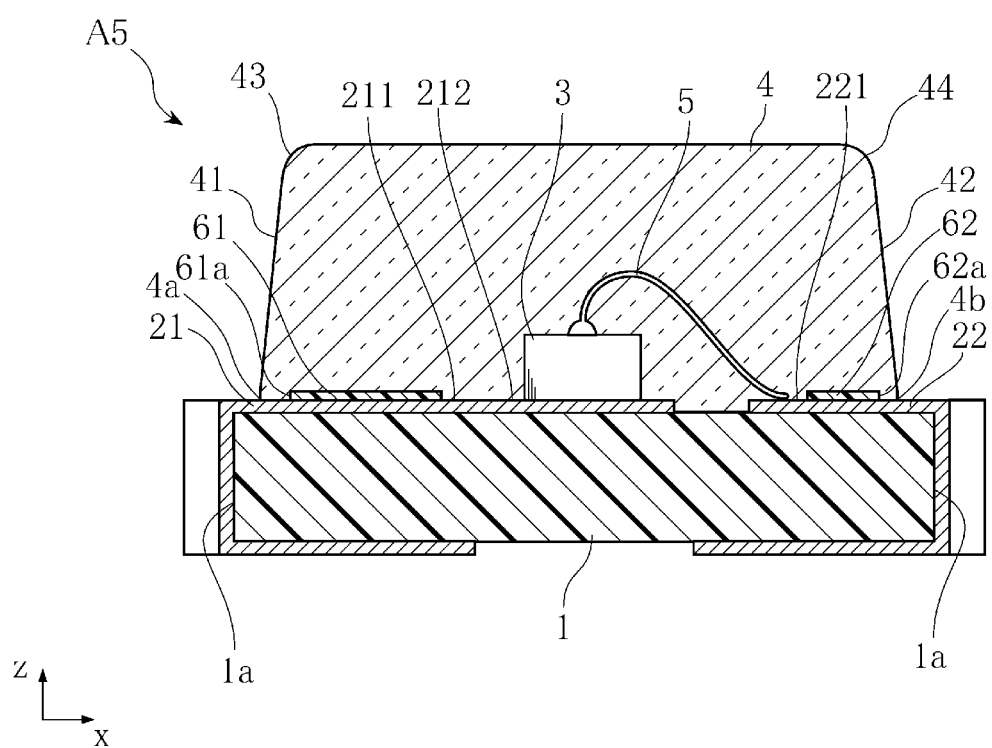
FIG. 7 is a section view showing a LED module according to a fifth embodiment of the present disclosure.

FIG. 7 shows a LED module A5 according to a fifth embodiment of the present disclosure. In the LED module A5 shown in FIG. 7, the clad member 6 is formed to be embedded into the encapsulating resin 4. Other configurations of the LED module A5 remain the same as those of the LED module A3.

As shown in FIG. 7, the left end 61*a* of the first clad member 61 is positioned at the right side of the left end 4*a* of the encapsulating resin 4 in the x direction. The right end 62*a* of the second clad member 62 is positioned at the left side of the right end 4*b* of the encapsulating resin 4 in the x direction.

Figure 8:
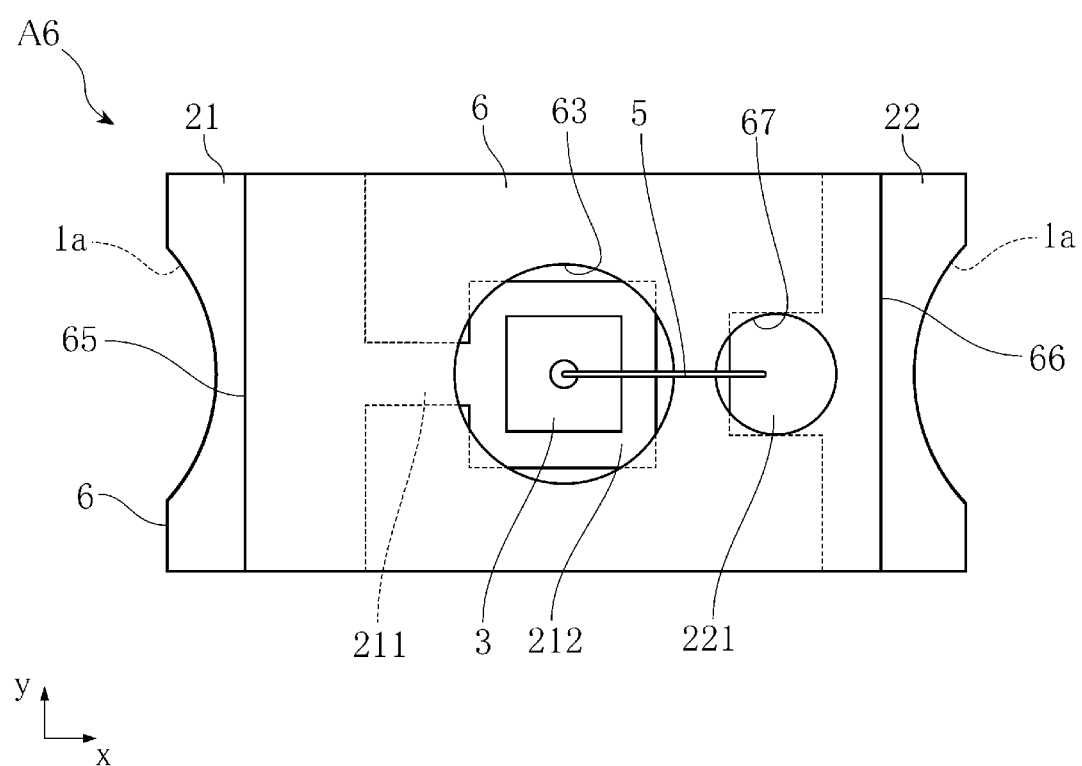
FIG. 8 is a plan view showing a LED module according to a sixth embodiment of the present disclosure, with an encapsulating resin omitted for clarity.

FIG. 8 shows a LED module A6 according to a sixth embodiment of the present disclosure. In the LED module A6 shown in FIG. 8, an opening 67 having a circular shape when seen in the z direction is formed in place of the recess 64. Other configurations of the LED module A6 remain the same as those of the LED module A2.

With this configuration, the clad member 6 may cover the metal wiring 2 over a broader area, thereby further restraining exfoliation of the encapsulating resin 4.

FIG. 9 shows a LED module A7 according to a seventh embodiment of the present disclosure. In the LED module A7 shown in FIG. 9, the clad member 6 is formed to cover only the upper surface of the metal wiring 2. Other configurations of the LED module A7 remain the same as those of the LED module A1. As stated above, this configuration is effective when the clad member 6 is smaller in reflectance than the substrate 1.

The LED modules according to the present disclosure are not limited to the embodiments described above. The specific configurations of the respective parts of the LED modules according to the present disclosure may be modified to many different designs.

For example, while an example in which die-bonding and wire-bonding are performed has been described in the foregoing embodiments, the present disclosure may be applied to an embodiment in which wire-bonding portions are provided in left and right electrodes and in which a LED chip and two wire-bonding portions are connected to each other by wire bonding. Moreover, the present disclosure may be applied to an embodiment in which a LED chip is flip-chip connected to left and right electrodes. In any event, the clad member is formed in a region other than the connection portions of the LED chip and the metal wiring.

According to the above embodiments of the present disclosure, it is possible to ameliorate the problem of the metal wiring and the encapsulating resin being hard to be bonded to each other, because the clad member is inserted between the metal wiring and the encapsulating resin. According to some embodiments of the present disclosure, when manufacturing the LED module, it is easy to pull out the encapsulating resin from the mold after the encapsulating resin is formed through the use of the mold. This helps to reduce the force exerted between the encapsulating resin and the substrate and prevent exfoliation of the encapsulating resin from the metal wiring. Accordingly, the LED module provided by the present disclosure becomes highly reliable.

While certain embodiments have been described, these embodiments have been presented by way of example only, and are not intended to limit the scope of the disclosures. Indeed, the novel LED modules described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosure.

What is claimed is:

1. A LED module, comprising:
   a substrate;
   a LED chip supported on the substrate;
   a metal wiring installed on the substrate, the metal wiring including a mounting portion on which the LED chip is mounted;
   an encapsulating resin configured to cover the LED chip and the metal wiring; and
   a clad member configured to cover an upper surface of the metal wiring,
   wherein the encapsulating resin is arranged to cover the clad member, and
   wherein an area of the metal wiring not covered by the clad member is smaller than an area of the clad member in contact with the encapsulating resin.

2. The LED module of claim 1, wherein the clad member has an opening formed to permit installation of the LED chip when seen in a thickness direction of the substrate.

3. The LED module of claim 2, wherein the mounting portion has a rectangular shape when seen in the thickness direction of the substrate, and the opening has a circular shape when seen in the thickness direction of the substrate.

4. The LED module of claim 3, wherein the clad member partially covers the mounting portion.

5. The LED module of claim 1, wherein the metal wiring includes a wire bonding portion spaced apart from the mounting portion, and a wire configured to interconnect the LED chip and the wire bonding portion, the clad member arranged to cover the metal wiring to expose the wire bonding portion.

6. The LED module of claim 5, wherein the clad member includes a recess dented to approach the mounting portion in an extension direction of the wire, the recess positioned to overlap with the wire bonding portion when seen in the thickness direction of the substrate.

7. The LED module of claim 5, wherein the metal wiring includes a first metal electrode containing the mounting portion and a second metal electrode containing the wire bonding portion, the first metal electrode formed to cover a first edge of the substrate in a first direction, the second metal electrode formed to cover a second edge of the substrate opposite the first edge, the encapsulating resin being shorter than the substrate.

8. The LED module of claim 7, wherein the substrate includes a pair of concave portions formed at opposite ends of the substrate, the pair of concave portions depressed toward one another, the metal wiring arranged to cover the pair of the concave portions, the encapsulating resin formed to expose the pair of the concave portions.

9. The LED module of claim 7, wherein a first end of the clad member and a first end of the encapsulating resin are at the same position in the first direction.

10. The LED module of claim 7, wherein a first end of the clad member extends toward a first end of the substrate further than a first end of the encapsulating resin in the first direction.

11. The LED module of claim 9, wherein a second end of the clad member and a second end of the encapsulating resin are at the same position in the first direction.

12. The LED module of claim 9, wherein a second end of the clad member extends further toward a second end of the substrate than a second end of the encapsulating resin in the first direction.

13. The LED module of claim 7, wherein the encapsulating resin is formed to cover entire width of the substrate in a second direction orthogonal to the first direction, the opposite ends of the clad member and opposite ends of the substrate being at the same positions in the second direction.

14. The LED module of claim 1, wherein the substrate is formed longer than the encapsulating resin in a first direction, a first side surface of the encapsulating resin inclining toward a second side surface in the first direction.

15. The LED module of claim 14, wherein the first side surface of the encapsulating resin includes an inclined surface inclined 6 degrees or more with respect to the thickness direction of the substrate.

16. The LED module of claim 4, wherein the first side surface of the encapsulating resin has a curved surface.

17. The LED module of claim 14, wherein the second side surface of the encapsulating resin inclines toward the first side surface in the first direction.

18. The LED module of any one of claim 17, wherein the second side surface of the encapsulating resin includes an inclined surface inclined 6 degrees or more with respect to the thickness direction of the substrate.

19. The LED module of claim 18, wherein the second side surface of the encapsulating resin is a curved surface.

20. The LED module of claim 1, wherein the clad member is made of a material with which the adhesion strength between the clad member and the metal wiring and the adhesion strength between the clad member and the encapsulating resin become greater than the adhesion strength between the metal wiring and the adhesion resin.

21. The LED module of claim 1, wherein the metal wiring includes a gold-plated layer.

22. The LED module of claim 21, wherein the clad member is made of a resin.

23. The LED module of claim 22, wherein the clad member has a white color.

24. The LED module of claim 1, wherein the clad member has a thickness of 1 μm to 10 μm.

* * * * *